United States Patent
Cheng et al.

(10) Patent No.: US 7,221,604 B2
(45) Date of Patent: May 22, 2007

(54) MEMORY STRUCTURE WITH REPAIRING FUNCTION AND REPAIRING METHOD THEREOF

(75) Inventors: Der-Kant Cheng, Hsinchu (TW); Ki-Hong Park, Santa Clara, CA (US)

(73) Assignee: AMIC Technology Corporation, Hsinchu (TW)

( * ) Notice: Subject to any disclaimer, the term of this patent is extended or adjusted under 35 U.S.C. 154(b) by 0 days.

(21) Appl. No.: 11/163,126

(22) Filed: Oct. 5, 2005

(65) Prior Publication Data
US 2006/0077733 A1    Apr. 13, 2006

(30) Foreign Application Priority Data
Oct. 7, 2004    (TW) .............................. 93130333 A

(51) Int. Cl.
*G11C 7/00*    (2006.01)
(52) U.S. Cl. .................. 365/200; 365/189.07; 714/718
(58) Field of Classification Search ................. 365/200
See application file for complete search history.

(56) References Cited
U.S. PATENT DOCUMENTS

| | | | |
|---|---|---|---|
| 4,376,300 A * | 3/1983 | Tsang ........................ 365/200 |
| 5,179,536 A * | 1/1993 | Kasa et al. .................. 365/200 |
| 5,206,831 A * | 4/1993 | Wakamatsu .................. 365/200 |
| 5,485,424 A * | 1/1996 | Kawamura .................... 365/200 |
| 5,566,114 A * | 10/1996 | Pascucci et al. ............. 365/200 |
| 5,933,376 A * | 8/1999 | Lee .............................. 365/200 |
| 6,571,352 B2 * | 5/2003 | Blodgett ........................ 714/6 |
| 6,868,019 B2 * | 3/2005 | Mohr et al. .................. 365/200 |
| 6,901,015 B2 * | 5/2005 | Shinohara .................... 365/200 |
| 6,910,152 B2 * | 6/2005 | Blodgett ........................ 714/6 |
| 6,985,391 B2 * | 1/2006 | Jung .......................... 365/200 |

* cited by examiner

*Primary Examiner*—Son L. Mai
(74) *Attorney, Agent, or Firm*—Jianq Chyun IP Office

(57) ABSTRACT

A memory structure with a repair function and a repairing method thereof are provided. The memory structure has an independent main memory unit and register file design. It also incorporates a record control unit for storing the fault information of the main memory unit. Upon receiving an access command, the memory structure determines if the main memory space pointed by the access command is faulty according to the stored fault information. When the main memory space pointed by the access command is faulty, a backup memory space is selected from the register file to replace the faulty main memory space. Therefore, the present invention can provide the convenience of a modularized design and reduce the space occupation of the register file, and also improve the access efficiency of the memory.

12 Claims, 8 Drawing Sheets

MEMORY STRUCTURE WITH REPAIRING FUNCTION AND REPAIRING METHOD THEREOF

CROSS-REFERENCE TO RELATED APPLICATION

This application claims the priority benefit of Taiwan application serial no. 93130333, filed on Oct. 7, 2004. All disclosure of the Taiwan application is incorporated herein by reference.

BACKGROUND OF THE INVENTION

1. Field of the Invention

The present invention relates to a memory. More particularly, the present invention relates to a memory structure with repairing function and a repairing method thereof.

2. Description of the Related Art

With rapid development in the electronic technology, information exchange has become a routine activity. Since information exchange relies heavily on media with a large storage capacity, fast-responding memories have become an indispensable storage media for all information systems. As the information flow continues to rise, the data transmission rate must also increase. Consequently, there is a constant need for an increase in the storage capacity of memory devices. In general, the yield of application specific integrated circuit (ASIC) is often affected by possible damages in the embedded memory. To increase the yield of the memory embedded ASIC and reduce the production cost, a memory with a repairing function has been developed. When a portion of the memory cells in a main memory is defective, the defective portion can be repaired using reserved memory.

In a conventional memory with repairing function, the locations of the defective bits are first recorded during a product trial period. Thereafter, a laser beam is applied to melt a fuse so that an entire row (or column) of backup memory can replace an entire row (or column) in the main memory containing faulty bits.

FIG. 1 is a block diagram of a conventional memory with repairing function. Aside from having a main memory circuit 110, the memory 100 also has a redundant memory circuit 120 for replacing an entire row or column of memory cells when some of the memory cells in a row or a column of the main memory circuit 110 are defective. Its method of operation is described in more details in the following.

First, the row (or column) address of the main memory circuit 110 containing the defective memory cells is recorded. Thereafter, a laser beam is applied to cut off the corresponding fuses inside a fuse box 130 so that the row (or column) address of the defective memory is recorded in the fuse box 130. To access this memory 100 with conventional repairing function, the access memory address A is compared with all the row (or column) addresses of the defective memory recorded in the fuse box 130 through a compare logic circuit. If the row (or column) address of the access memory is one of the row (or column) addresses of the defective memory, the compare logic circuit 140 outputs a repair signal R representing the row (or column) address of the defective memory to a routing logic circuit 150. Thereafter, the routing logic circuit 150 changes the access pathway from the defective main memory circuit 110 to a backup memory address in the redundant memory circuit 120 corresponding a the row (or column) address of the defective memory.

Obviously, the repairing function of the conventional memory 100 has the following disadvantages.

1. The compare logic circuit 140 changes the access pathway of the routing logic circuit 150 only after the compare logic circuit 140 has received the access memory address and compared with all the row (or column) addresses containing defective memory recorded in the fuse box 130. Hence, the access efficiency is very low.

2. Because the repair is achieved by replacing an entire row or column, the ratio of the redundant memory circuit 120 to main memory remains high despite of significant improvement in processing capability and reduction in defect density.

3. The memory 100 with repairing function designed according to ASIC principles normally adopts a full custom design rather than an independent and separate memory circuit module and backup memory module design. Hence, the development time is longer, the application is rather inflexible and the design cost is high.

SUMMARY OF THE INVENTION

Accordingly, at least one objective of the present invention is to provide a memory structure having a repair function with an independent main memory unit and a register file to provide convenience through a modularized design. To access data, the address of the data is determined and then an enable signal is used to decide if a replacement with backup memory space is required. Hence, the accessing efficiency of the memory is improved.

At least another objective of the present invention is to provide a method for repairing memory. When the main memory space in a main memory unit is faulty, the faulty main memory space is replaced using a register file having the same number of bits as the main memory space rather than replacing an entire row or entire column. Thus, the proportion of the register files in the memory space can be reduced through adding and subtracting the number of backup memories according to the actual defect density.

To achieve these and other advantages and in accordance with the purpose of the invention, as embodied and broadly described herein, the invention provides a memory structure with a repair function. The repairable memory structure comprises a main memory, a register file, a record control unit and a re-buffer multiplexer. The main memory unit has a plurality of main memory spaces. The register file has a plurality of backup memory spaces. Furthermore, the number of bits in each backup memory space is identical to the number of bits in each main memory space. The record control unit is coupled to the main memory unit and the register file for storing faulty information of the main memory unit. When the record control unit receives an access command, the main memory space pointed by the access command is determined to be faulty or not according to the pre-stored fault information. If the main memory space pointed by the access command is faulty, then the record control unit selects a backup memory space from the register file to replace the defective main memory space. The re-buffer multiplexer is coupled to the data input/output terminal of the main memory unit and the register file. When the main memory space pointed by the access command is faulty, the record control unit provides the control such that the register file provides the access data through the re-buffer multiplexer or else the main memory unit provides the access data through the re-buffer multiplexer.

According to an alternative perspective, the present invention also provides a memory repair method. The repairable memory comprises a main memory unit with a plurality of main memory spaces and a register file with a plurality of backup memory spaces. The number of bits in each backup memory space is identical to the number of bits in each main memory space. The method of repairing the memory includes the following steps. First, the main memory spaces of the main memory unit are tested and then the faulty information of the main memory spaces is stored. Upon receiving an access command, the main memory space pointed by the access command is determined to be faulty or not according to the faulty information. When the main memory space pointed by the access command is faulty, one of the backup memory spaces is selected from the register file to replace the faulty main memory space.

Accordingly, the present invention adopts a separate and independent main memory unit and register file design. Thus, the convenience of a modular design is provided. When the main memory space of a main memory unit is faulty, the defective memory space is replaced using a register file having the same number of bits as the main memory space rather than replacing it with an entire row or column. Hence, the space occupation of the register files can be reduced. To perform an access, the data is accessed first. Then, an enabling signal is provided to decide if the main memory needs to be replaced with a backup memory space or not. As a result, the memory access efficiency can be substantially improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE EMBODIMENTS

Figure 1:
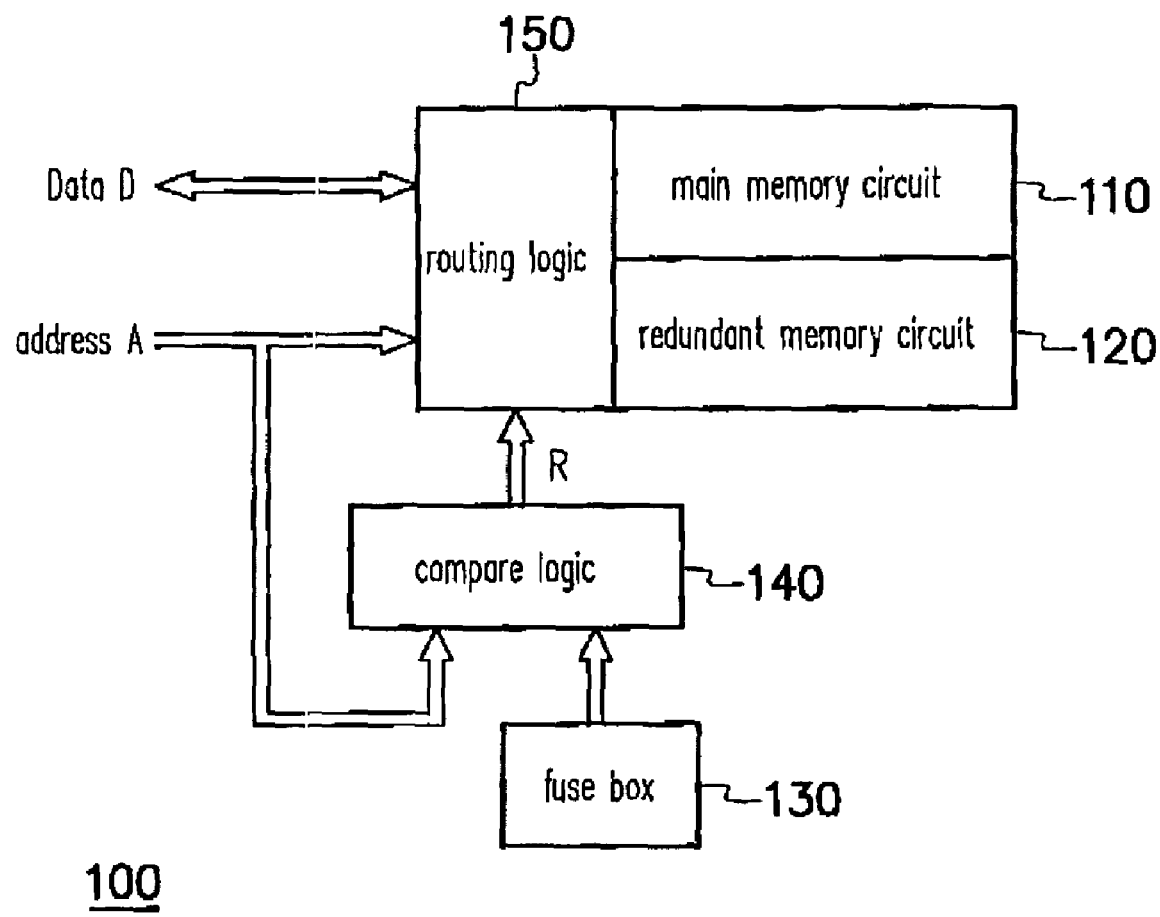
FIG. 1 is a block diagram of a conventional memory with a repair function.

Reference will now be made in detail to the present preferred embodiments of the invention, examples of which are illustrated in the accompanying drawings. Wherever possible, the same reference numbers are used in the drawings and the description to refer to the same or like parts.

Figure 2:
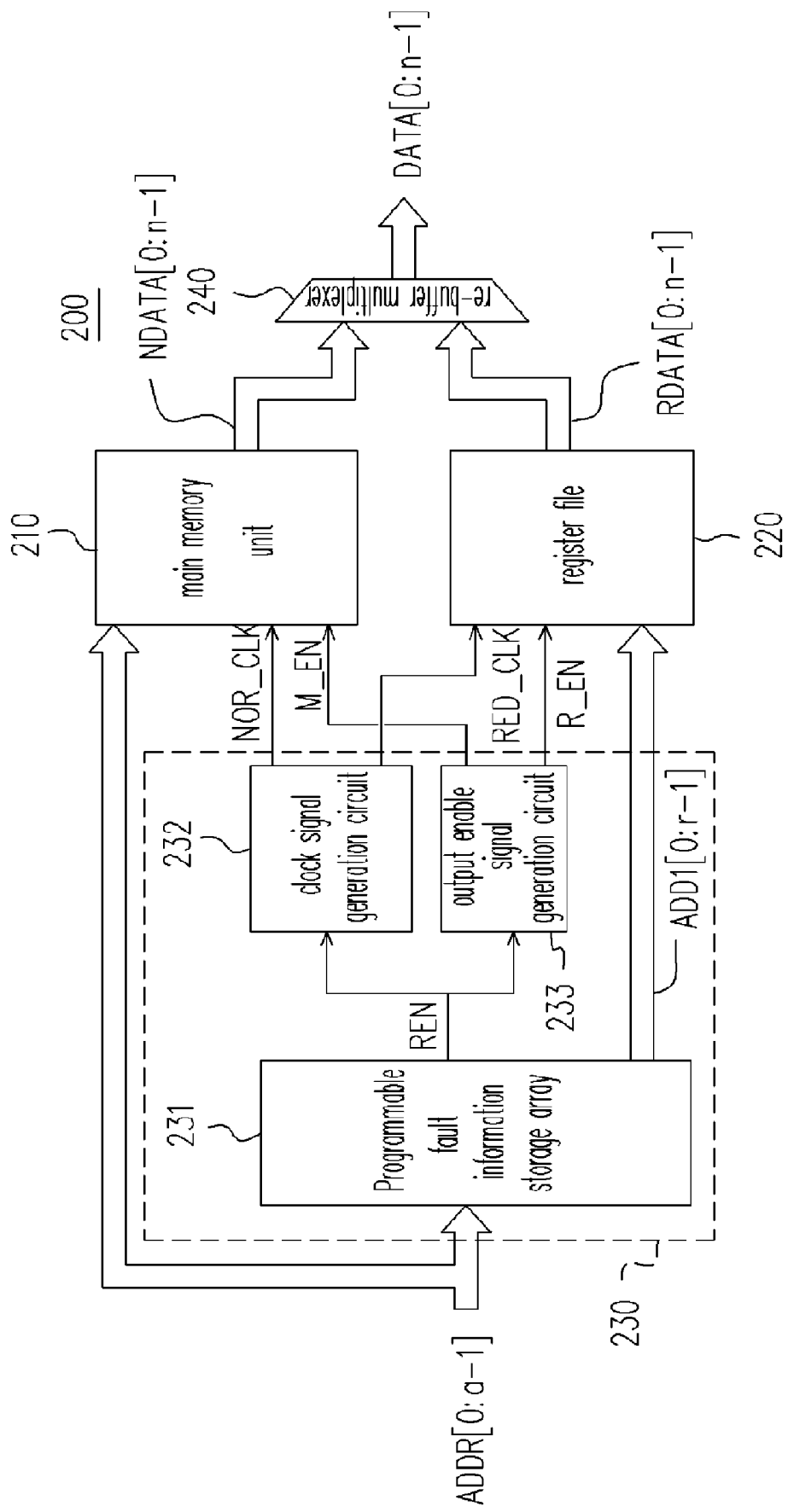
FIG. 2 is a block diagram of a memory structure with a repair function according to one embodiment of the present invention.

FIG. 2 is a block diagram of a memory structure with a repair function according to one embodiment of the present invention. As shown in FIG. 2, the memory 200 with repair function mainly comprises a main memory unit 210, a register file 220, a record control unit 230 and a re-buffer multiplexer 240. The main memory unit 210 comprises four 8K×40 bit memory modules and the register file 220 comprises a 64×40 bit memory module. In other words, the main memory unit 210 has 32K of 40-bit main memory spaces and the register file 220 has 64 40-bit backup memory spaces. In the present embodiment, independently designed main memory unit 210 and register file 220 are used so that the convenience of a modularized designed can be easily achieved. Furthermore, when any of the main memory spaces within the main memory unit 210 is faulty, the faulty main memory space can be replaced by one of the backup memory spaces in the register file with the same storage capacity, rather than replacing it with an entire row or column. In other words, the space occupation of the register file 220 can be reduced to only 0.5 of one thousandth of the main memory unit 210. Obviously, anyone familiar with the technology may notice that the space occupation of the backup memory space for this type of repairable memory 200 can be easily modified to reflect the actual demand.

As shown in FIG. 2, the record control unit 230 is coupled to the main memory unit 210 and the register file 220. The record control unit 230 comprises a programmable fault information storage array 231, a clocking signal generation circuit 232 and an output enable signal generation circuit 233. The programmable fault information storage array 231 is a storage circuit for storing the fault information of the main memory unit 210 including a laser fuse box, an anti-fuse box or a flash memory, for example. When the repairable memory 200 receives an access command, the main memory space pointed by the address ADDR[0:a-1] (for example, 'a' bits of address data) of the access command is determined to be faulty or not according to the stored fault information. If the main memory space pointed by the address ADDR[0:a-1] of the access command is faulty, then a backup memory address ADD1[0:r-1] (for example, 'r' bits of address data) is submitted so that one of the backup memory spaces is selected from the register file 220 to replace the faulty main memory space.

In the present embodiment, the main memory unit 210 and the register file 220 use an output bus with both a re-buffer and a multiplexing (MUX) function. Hence, when the main memory space pointed by the address ADDR[0:a-1] of the access command is fault-free, the decision signal REN from the programmable fault information storage array 231 directs the output enable signal generation circuit 233 to produce a main memory unit enable signal M_EN that enables the main memory unit 210 to store up the data. After addressing the main memory unit 210 through the address ADDR[0:a-1] to prepare the data, the main memory unit enable signal M_EN produced by the output enable signal generation circuit 233 has already arrived. Thus, there is no need to wait until the comparison between the access memory address A and all the row (or column) addresses of the defective memory recorded by the fuse box 130 through the compare logic circuit 140 is complete before determining the access pathway through the routing logic circuit 150 as in FIG. 1. Consequently, the access efficiency of the repairable memory is enhanced.

In addition, when the main memory space pointed by the address ADDR[0:a-1] of the access command is faulty, the decision signal REN from the programmable fault information storage array 231 directs the output enable signal generation circuit 233 to produce a register file enable signal R_EN that enables the register file 220. Therefore, the backup memory address ADD1[0:r-1] provided by the programmable fault information storage array 231 can select a backup memory space from the register file 220 and access that memory instead of the defective main memory space.

Figure 3:
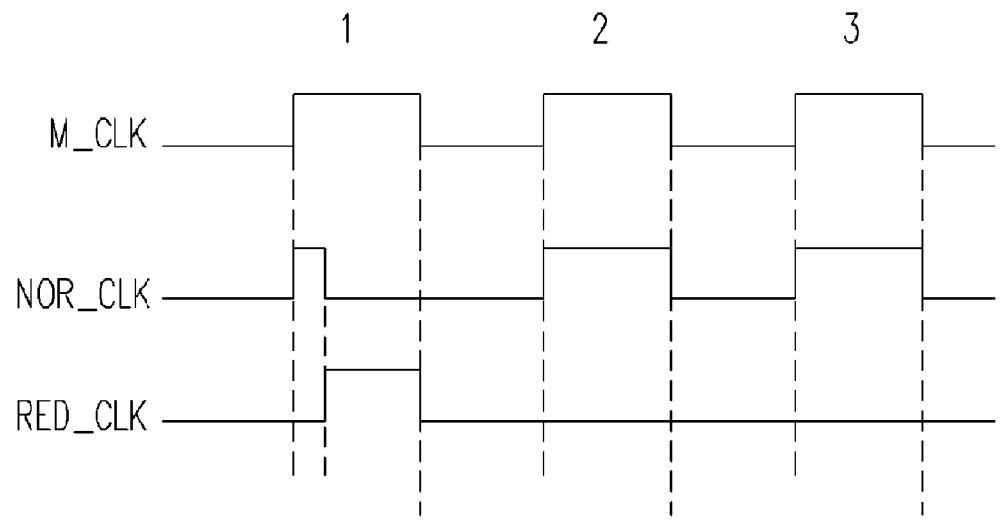
FIG. 3 is a diagram showing the timing signals produced by a clocking signal generation circuit.

Because the memory module used in the main memory unit 210 and the register file 220 are synchronous memory, the record control unit 230 includes the clock signal generation circuit 233 for generating the clocking signals that drive the main memory unit 210 and the register file 220. FIG. 3 is a diagram showing the timing signals produced by a clocking signal generation circuit. When the main clocking signal M_CLK is in the first cycle, because the main memory space pointed by the address ADDR[0:a-1] of the access command is faulty, the clock generator circuit 233, according to the indication of the decision signal REN output from the programmable fault information storage array 231, terminates the reference clock signal NOR_CLK for the main memory unit 210 and generates a reference clock signal RED_CLK for the register file 220. When the clocking signal CLK is in the second and the third cycle, because the main memory space pointed by the address ADDR[0:a-1] is fault-free, the clock generator circuit 233, according to the indication of the decision signal REN output from the programmable fault information storage array 231, maintains the reference clock signal NOR_CLK for the main memory unit 210 and avoids generating a reference clock signal RED_CLK for the register file 220.

Figure 4:
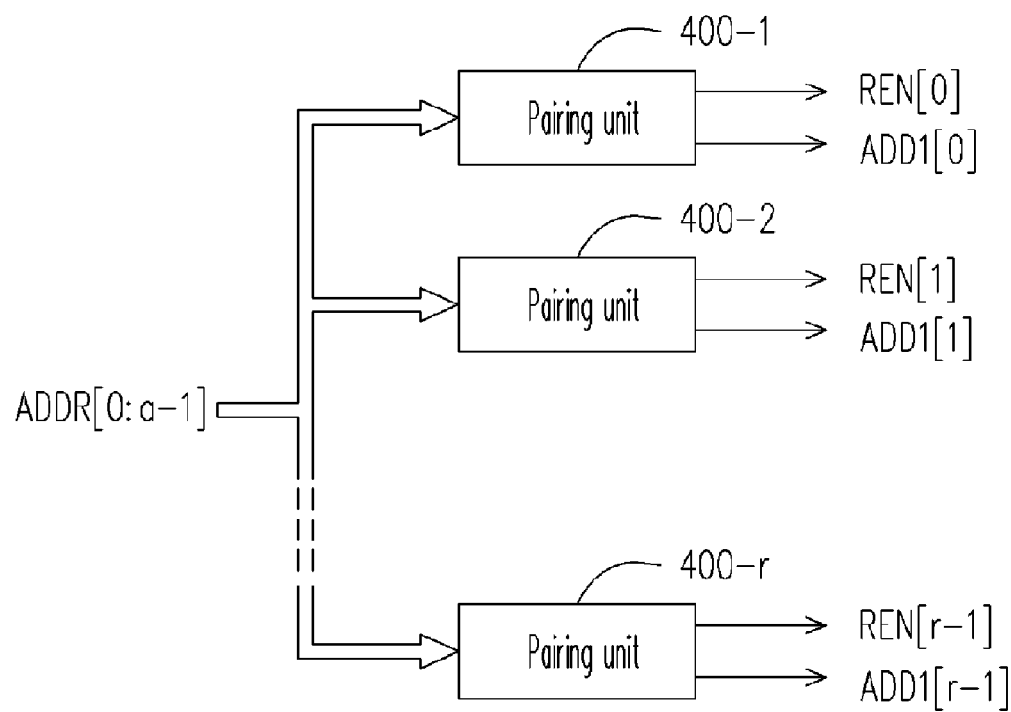
FIG. 4 is a diagram showing an embodiment of the programmable faulty information storage array shown in FIG. 2.

FIG. 4 is a diagram showing an embodiment of the programmable fault information storage array 231 shown in FIG. 2. Here, it is assumed there are 'r' backup units (backup memory spaces) in the register file 220. As shown in FIG. 4, the programmable fault information storage array 231 has altogether 'r' pairing units 400-1~400-r. Each pairing unit is coupled to a corresponding backup unit (backup memory space). Furthermore, each piece of fault information (the fault address of the main memory) is stored in one of the pairing units (400-1~400-r). For example, the first main memory fault address can be stored in the pairing unit 400-1, and the second main memory fault address can be stored in the pairing unit 400-1, and so on. When the address ADDR[0:a-1] of the access command is transmitted to the programmable fault information storage array 231, the pairing units (400-1~400-r) simultaneously compare its internal pre-stored fault address with the address ADDR[0:a-1]. If the main memory fault address stored inside one of the pairing units (400-1~400-r), for example, the pairing unit 400-2, matches the received address ADDR[0:a-1], then the corresponding bit of the backup memory address (for example, the backup memory address bit ADD1[1]) is output to a corresponding backup unit of the register file 220 and the corresponding bits of the decision signal REN (for example, the decision signal bit REN[1]) is output. Therefore, the register file 220 does not need to decode the received backup memory address ADD1 [0:r-1] before addressing the corresponding backup unit (the backup memory space). Hence, the accessing efficiency of the register file 220 is improved.

Figure 5:
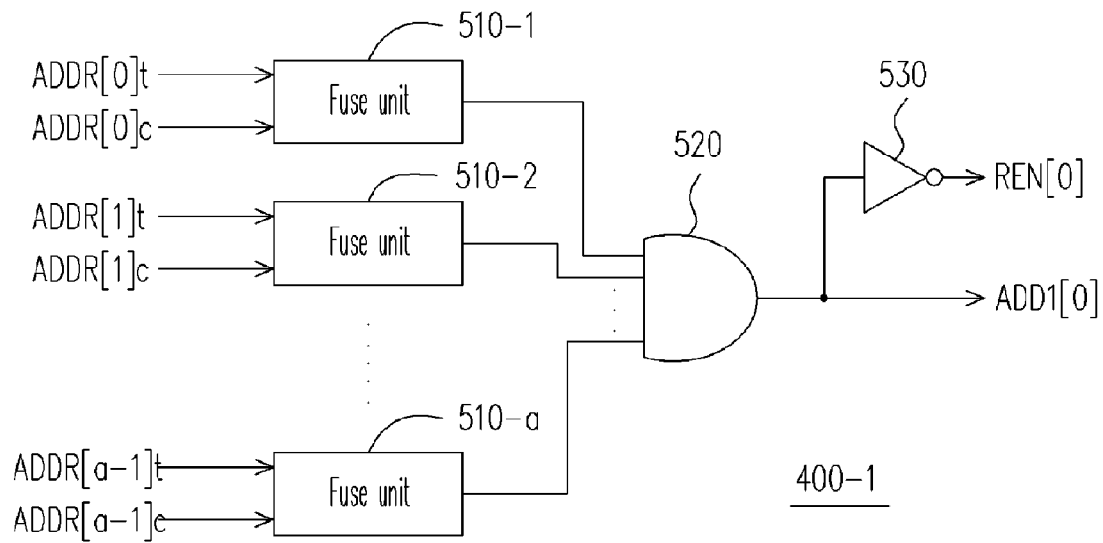
FIG. 5 is a diagram showing an embodiment of the pairing unit shown in FIG. 4.

FIG. 5 is a diagram showing an embodiment of the pairing unit 400-1 shown in FIG. 4. Other pairing units 400-2~400-r have a configuration identical to the one in FIG. 5. Here, it is assumed the address ADDR[0:a-1] of the access command is a differential signal. Hence, each bit (for example, ADDR[0]) of the address ADDR[0:a-1] includes a true signal (for example, ADDR[0]t) and a complementary signal (for example, ADDR[0]c). In the pairing unit 400-1, each of the fuse units 510-1~510-a receives the true signal and the complementary signal of a corresponding bit and compares with a corresponding bit of the main memory fault address stored inside the pairing unit. If there is a match in the comparison, the pairing unit outputs a logic value '1'. Otherwise, the pairing unit outputs a logic value '0'. The input terminals of the AND gate are connected to respective output terminal of the fuse units 510-1~510-a. The output terminal of the AND gate 520 outputs the backup memory address bit ADD1 [0]. When the fuse units 510-1~510-a simultaneously output the logic value '1' (the address ADDR[0:a-1] of the access command completely matches the main memory fault address stored inside the pairing unit 400-1), the AND gate 520 outputs a logic value '1'. Otherwise, the AND gate 520 outputs a logic value '0'. The inverter 530 receives the bit ADD1[0] output from the AND gate 520 and outputs an inverted signal to serve as the decision signal bit REN[0].

Figure 6:
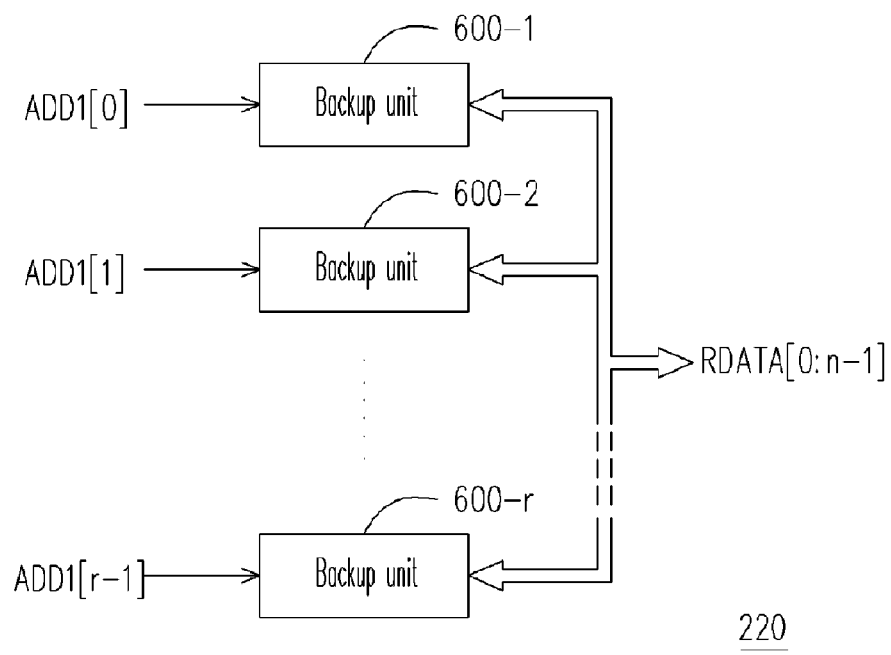
FIG. 6 is a diagram showing an embodiment of the register file shown in FIG. 2.

FIG. 6 is a diagram showing an embodiment of the register file 220 shown in FIG. 2. Here, it is assumed the register file 220 has altogether 'r' backup units (backup memory spaces) 600-1~600-r. As shown in FIG. 6, the backup units 600-1~600-r receive respective backup memory address bit ADD1[0]~ADD1[r-1] and accordingly determine if an access to its internal data is provided or not.

Figure 7:
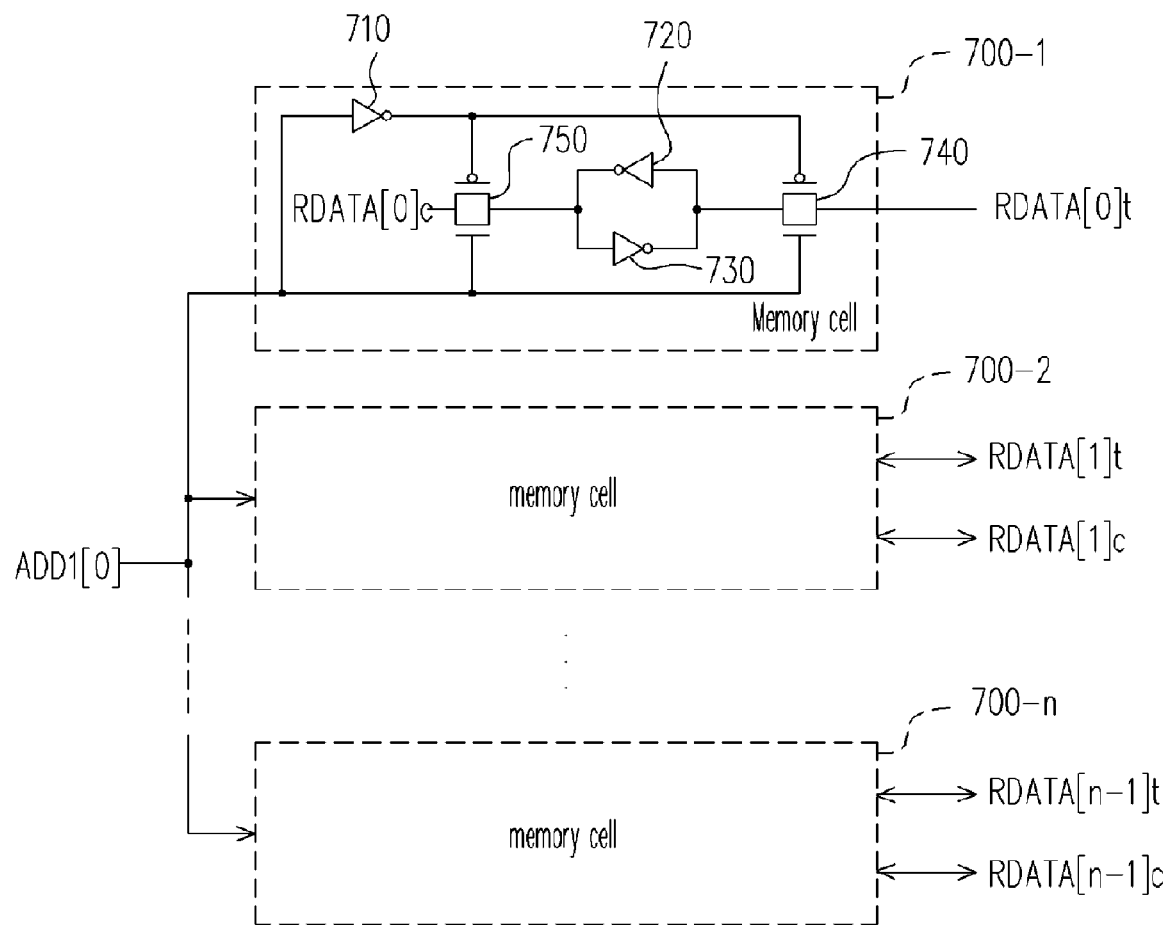
FIG. 7 is a diagram showing an embodiment of the backup unit shown in FIG. 6.

FIG. 7 is a diagram showing an embodiment of the backup unit 600-1 shown in FIG. 6. Other backup units 600-2~600-r have a configuration identical to the one in FIG. 7. Here, it is assumed each backup memory space has n bits. Thus, the backup unit 600-1 includes n memory cells 700-1~700-n. In addition, it is assumed the access data RDATA[0:n-1] of the n bits is a differential signal. Then, each bit of the data RDATA[0:n-1] includes a true signal and a complementary signal. For example, the data bit RDATA[0] includes a true signal RDATA[0]t and a complementary signal RDATA[0]c and the data bit RDATA[1] includes a true signal RDATA[1]t and a complementary signal RDATA[1]c and so on. According to the corresponding bit ADD1 [0] of the backup memory address, each of the memory cells 700-1~700-n decides if an access to its internal data is provided or not.

As shown in FIG. 7, the memory cell 700-1 is used as an example in the following description. Other memory cells 700-2~700-n have configurations identical to the one in FIG. 7. The memory cell 700-1 includes an enable terminal, a data access terminal, a complementary data access terminal, a fifth inverter 710, a sixth inverter 720, a seventh inverter 730, a first pass gate 740 and a second pass gate 750. The enable terminal receives the bit ADD1[0] corresponding to the backup memory address. The data access terminal is connected to the data bit RDATA[0]t and the complementary data access terminal is connected to the data bit RDATA[0]c. The input terminal of the fifth inverter 710 is coupled to the enable terminal for receiving the bit ADD1[0]. The sixth inverter 720 and the seventh inverter are serially connected together to form a latching unit. The first gate of the first pass gate 740 is coupled to the enable terminal for receiving the bit ADD1[0] and the second gate of the first pass gate 740 is coupled to the output terminal of the fifth inverter 710. The first connecting terminal of the first pass gate 740 is coupled to the data access terminal (the data bit RDATA[0]t) and the second connecting terminal of the first pass gate 740 is coupled to the input terminal of the sixth inverter 720 and the output terminal of the seventh inverter 730. The first gate of the second pass gate 750 is coupled to the enable terminal for receiving the bit ADD1[0] and the second gate of the second pass gate 750 is coupled to the output terminal of the fifth inverter 710. The first connecting terminal of the second pass gate 750 is coupled to the complementary data access terminal (the data bit RDATA[0]c) and the second connecting terminal of the second pass gate 750 is coupled to the output terminal of the sixth inverter 720 and the input terminal of the seventh inverter 730.

Figure 8:
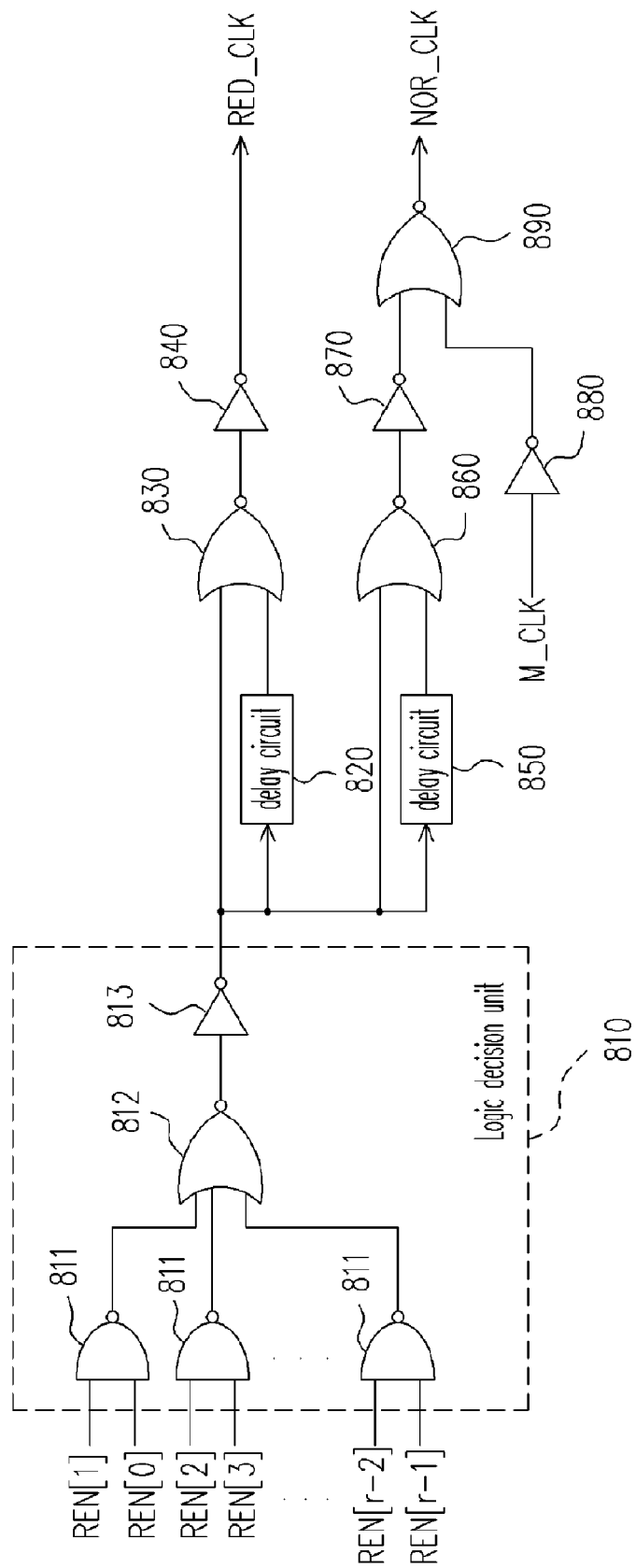
FIG. 8 is a diagram showing an embodiment of the clocking signal generation circuit shown in FIG. 2.

FIG. 8 is a diagram showing an embodiment of the clocking signal generation circuit 232 shown in FIG. 2. As shown in FIG. 8, the clocking signal generation circuit 232 includes a logic decision unit 810, a first delay circuit 820, a second delay circuit 850, a first NOR gate 830, a second NOR gate 860, a third NOR gate 890, a first inverter 840, a second inverter 870 and a third inverter 880. The logic decision unit 810 receives the decision signal REN output from the programmable fault information storage array 231 and accordingly determines if the main memory space pointed by the access command is faulty or not and then outputs the result. Here, the logic decision unit 810 includes a plurality of NAND gates 811, a fourth NOR gate 812 and a fourth inverter 813. Each input terminal of each NAND gate 811 is coupled to one of the corresponding bits REN[0]~REN[r-1] of the decision signal REN. The input terminals of the fourth NOR gate 812 are coupled to respective output terminal of the NAND gates 811. The input terminal of the fourth inverter 813 is coupled to the output terminal of the fourth NOR gate 812. The output terminal of the fourth inverter 813 outputs the decision result.

The first delay circuit 820 receives the decision result from the logic decision unit 810 and outputs a delayed decision result. The first NOR gate 830 receives the output from the logic decision unit 810 and the output from the first delay circuit 820. The output terminal of the first inverter 840 is coupled to the output terminal of the first NOR gate 830. The output terminal of the first inverter 840 outputs the clocking signal RED_CLK required by the register file 220.

The second delay circuit 850 receives the decision result from the logic decision unit 810 and outputs a delayed decision result. The second NOR gate 860 receives the output from the logic decision unit 810 and the output from the second delay circuit 850. The input terminal of the second inverter 870 is coupled to the output terminal of the second NOR gate 860. The input terminal of the third inverter 880 is coupled to the main clocking signal M_CLK. The first input terminal and the second input terminal of the third NOR gate 890 are coupled to the output terminal of the second inverter 870 and the output terminal of the third inverter 880 respectively. The output terminal of the third NOR gate 890 outputs the clocking signal NOR_CLK required by the main memory unit 210.

Figure 9:
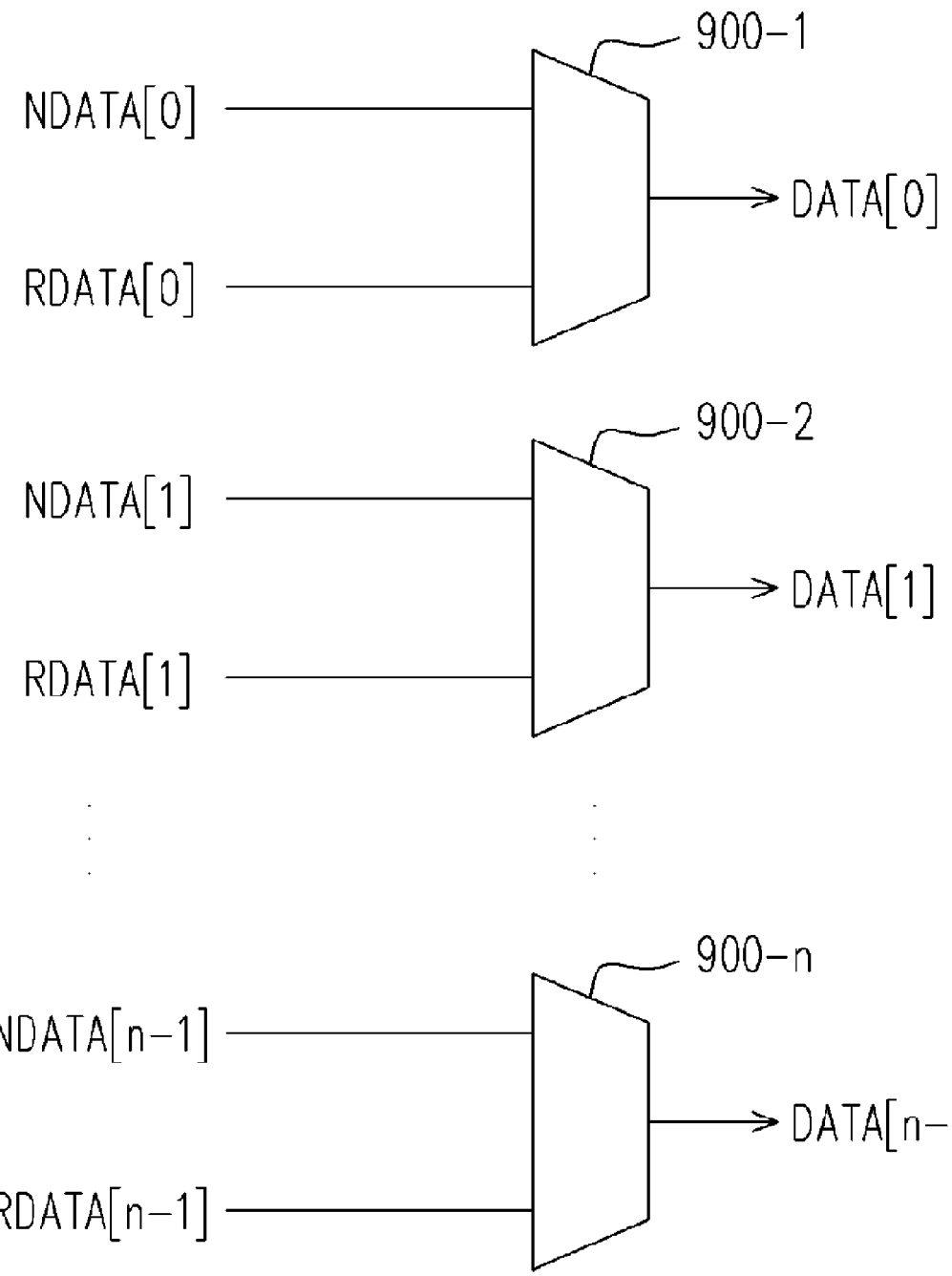
FIG. 9 is a diagram showing an embodiment of the re-buffer multiplexer shown in FIG. 2.

FIG. 9 is a diagram showing an embodiment of the re-buffer multiplexer 240 shown in FIG. 2. As shown in FIG. 9, the re-buffer multiplexer 240 includes n re-buffer multiplexing units 900-1~900-n. Each of the re-buffer multiplexing units 900-1~900-n receives a corresponding bit of the data NDATA[0:n-1] from the main memory unit 210 and a corresponding bit of the data RDATA[0:n-1] from the register file 220. According to the control of the record control unit 230, the re-buffer multiplexing units 900-1~900-n choose to output the data from the main memory unit 210 or the data from the register file 220 to serve as the output data DATA[0:n-1] for the memory 200 with a repair function. For example, the re-buffer multiplexing unit 900-2 chooses output the data bit NDATA[1] or the data bit RDATA[1] to serve as the output data bit DATA[1] of the memory 200 through the control of the record control unit 230.

Figure 10:
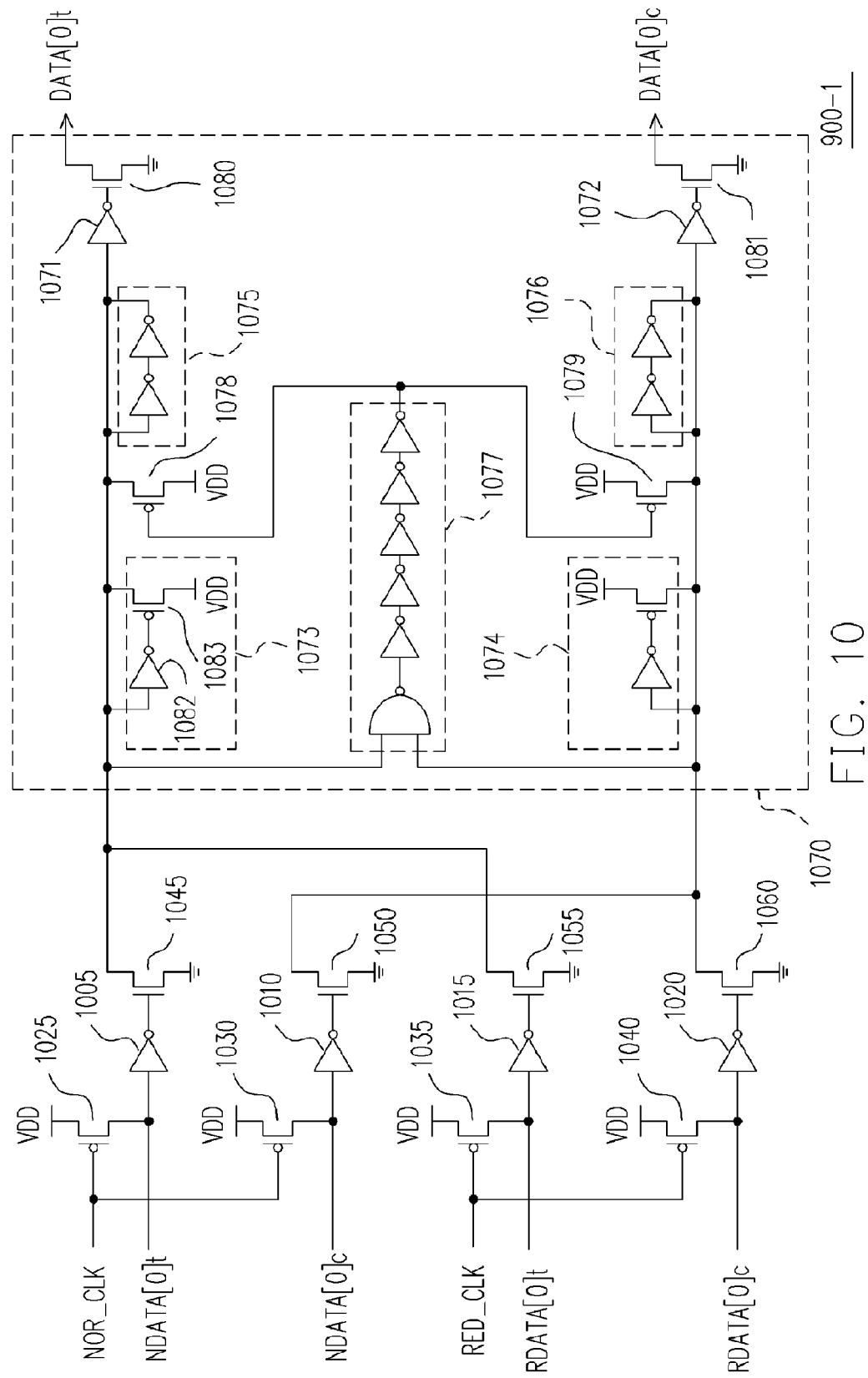
FIG. 10 is a diagram showing an embodiment of the re-buffer multiplexing unit shown in FIG. 9.

FIG. 10 is a diagram showing an embodiment of the re-buffer multiplexing unit 900-1 shown in FIG. 9. Other re-buffer multiplexing units 900-2~900-n have a configuration identical to the one in FIG. 10. Here, it is assumed the access data RDATA[0:n-1], NDATA[0:n-1] and DATA[0:n-1] are n-bit differential signals. Hence, each bit of the data RDATA[0:n-1], NDATA[0:n-1] and DATA[0:n-1] includes a true signal and a complementary signal. For example, the data bit NDATA[0] includes a true signal NDATA[0]t and a complementary signal NDATA[0]c, the data bit RDATA[0] includes a true signal RDATA[0]t and a complementary signal RDATA[0]c and the data bit DATA[0] includes a true signal DATA[0]t and a complementary signal DATA[0]c.

As shown in FIG. 10, the re-buffer multiplexing unit 900-1 includes an eighth inverter 1005, a ninth inverter 1010, a tenth inverter 1015, an eleventh inverter 1020, a first P-type transistor 1025, a second P-type transistor 1030, a third P-type transistor 1035, a fourth P-type transistor 1040, a first N-type transistor 1045, a second N-type transistor 1050, a third N-type transistor 1055, a fourth N-type transistor 1060 and a re-buffer 1070. The input terminal of the inverter 1005 receives a corresponding bit NDATA[0]t of the output data NDATA[0:n-1] from the main memory unit 210. The input terminal of the inverter 1010 receives a corresponding bit NDATA[0]c of the output data NDATA[0:n-1] from the main memory unit 210. The input terminal of the inverter 1015 receives a corresponding bit RDATA[0]t of the output data RDATA[0:n-1] from the register file 220. The input terminal of the inverter 1020 receives a corresponding bit RDATA[0]c of the output data RDATA[0:n-1] from the register file 220. The gate of the transistors 1025 and 1030 receives the closing signal NOR_CLK from the clocking signal generation circuit 232. The source of the transistors 1025 and 1030 is coupled to a first voltage (a voltage source VDD in the present embodiment). The drain of the transistors 1025 and 1030 are coupled to respective input terminal of the inverter 1005 and the inverter 1010. The gate of the transistors 1035 and 1040 receives the clocking signal RED_CLK from the clocking signal generation circuit 233. The source of the transistors 1035 and 1040 is coupled to the first voltage (the voltage source VDD). The drain of the transistors 1035 and 1040 are coupled to respective output terminal of the inverter 1015 and the inverter 1020.

The gate of the N-type transistors 1045, 1050, 1055 and 1060 are coupled to the output terminal of the inverters 1005, 1010, 1015 and 1020 respectively. The drain of the transistors 1045 and 1055 are coupled to the first input terminal of the re-buffer 1070 and the source of the transistors 1045 and 1055 are connected to a second voltage (a ground voltage in the present embodiment). The drain of the transistors 1050 and 1060 are coupled to the second input terminal of the re-buffer 1070 and the source of the transistors 1050 and 1060 are connected to the second voltage (a ground voltage).

The re-buffer 1070 includes a twelfth inverter 1071, a thirteenth inverter 1072, a first pull-up circuit 1073, a second pull-up circuit 1074, a first memory unit 1075, a second memory unit 1076, an AND unit 1077, a fifth P-type transistor 1078, a sixth P-type transistor 1079, a fifth N-type transistor 1080 and a sixth N-type transistor 1081. The input terminal of the inverter 1071 is coupled to the first input terminal of the re-buffer 1070. The pull-up circuit 1073 is coupled to the input terminal of the inverter 1071. When the first input terminal of the re-buffer 1070 is at a logic value '1', the pull-up circuit 1073 raises the input terminal of the inverter 1071 to the first voltage (the voltage source VDD). The memory unit 1075 is coupled to the input terminal of the inverter 1071 for maintaining the logic state in the first input terminal of the re-buffer 1070.

The input terminal of the inverter 1072 is coupled to the second input terminal of the re-buffer 1070. The pull-up circuit 1074 is coupled to the input terminal of the inverter 1072. When the second input terminal of the re-buffer 1070 is at a logic value of '1', the input terminal of the inverter 1072 is raised to the first voltage (the voltage source VDD). The memory unit 1076 is coupled to the input terminal of the inverter 1072 for maintaining the logic state in the second input terminal of the re-buffer 1070.

The aforesaid memory units 1075 and 1076 can be implemented using an assembly comprising a pair of serially connected inverters. Furthermore, the pull-up circuits 1073 and 1074 can be implemented using an assembly comprising an inverter and a P-type transistor. Using the pull-up circuit 1073 as an example, it comprises an inverter 1082 and a P-type transistor 1083. The input terminal of the inverter 1082 is coupled to the input terminal of the inverter 1072 and the output terminal of the inverter 1082 is coupled to the gate of the transistor 1083. The source of the transistor 1083 is connected to the voltage source VDD and the drain of the transistor 1083 is coupled to the input terminal of the inverter 1072.

The first input terminal and the second input terminal of the AND unit 1077 are coupled to the first input terminal and the second input terminal of the re-buffer 1070 respectively for performing an AND computation of the first and the second input terminal. After a designated period of delay, the computed result is output to the gate of the P-type transistors 1078 and 1079. The source of the transistors 1078 and 1079 are coupled to the first voltage (the voltage source VDD) and the drain of the transistors 1078 and 1079 are coupled to the input terminal of the inverter 1071 and the input terminal of the inverter 1072 respectively.

The gate of the transistor 1080 is coupled to the output terminal of the inverter 1071 and the source of the transistor 1080 is coupled to the second voltage (the ground voltage). The drain of the transistors 1080 is coupled to the first input terminal of the re-buffer 1070 for outputting the data bit DATA[0]t. The gate of the transistor 1081 is coupled to the output terminal of the inverter 1072 and the source of the transistor 1081 is connected to the second voltage (the ground voltage). The drain of the transistor 1081 is coupled to the second output terminal of the re-buffer 1070 for outputting the data bit DATA[0]c.

According to the aforementioned description, a memory repair method is provided. The memory comprises a main memory unit 210 with a plurality of main memory spaces and a register file 220 with a plurality of backup memory spaces. The number of bits in each backup memory space is identical to the number of bits in each main memory space. The memory repair method includes the following steps. First, the main memory spaces of the main memory unit 210 are tested and any fault information in the main memory spaces is recorded and stored. Upon receiving an access command, the memory space pointed by the access command is determined to be faulty or not according to the stored fault information. If the main memory space pointed by the access command is faulty, a backup memory space is selected from the register file to replace the faulty main memory space.

The required fault information can be stored inside a laser fuse box, an anti-fuse box or a flash memory, for example.

In summary, major advantages of the present invention includes at least the following.

1. Because the main memory unit and the register file are independently and separately designed, the convenience of a modularized design is provided.

2. When the main memory space within the main memory unit is faulty, the faulty main memory space can be replaced by a backup memory space with the same number of bits as the main memory space rather than using an entire row or column. Hence, the space occupation of the register file relative to the main memory is reduced.

3. Furthermore, in an accessing operation, the data is accessed and then the need for replacing the main memory with backup memory space is determined by an enable signal. Therefore, the accessing efficiency of the memory is significantly increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A memory structure with a repair function, comprising:
   a main memory unit having a plurality of main memory spaces;
   a register file having a plurality of backup memory spaces, wherein the number of bits in each backup memory space is the same as the number of bits in each main memory space;
   a record control unit coupled to the main memory unit and the register file for storing fault information of the main memory unit, wherein, upon receiving an access command, the record control unit determines if the main memory space pointed by the access command is faulty according to the fault information, and if the main memory space pointed by the access command is faulty, a backup memory space is selected from the register file to replace the defective main memory space; and
   a re-buffer multiplexer coupled to the data input/output terminal of the main memory unit and the data output terminal of the register file, wherein if the main memory space pointed by the access command is faulty, the register file is accessed through the re-buffer multiplexer under the control of the record control unit; if the main memory unit is fault-free, the main memory unit is accessed through the re-buffer multiplexer, wherein the record control unit comprises:
   a programmable fault information storage array for storing the fault information of the main memory unit, and according to the fault information, determining if the received main memory space pointed by the access command is faulty; if the main memory space is determined to be faulty, a backup memory address corresponding to the defective main memory space and a decision signal are issued; and
   a clocking signal generation circuit coupled to the programmable fault information storage array for generating the required clocking signals for the main memory unit and the register file according to the decision signal; wherein the register file accesses the corresponding data through the re-buffer multiplexer according to the routing of the backup memory address.

2. The memory structure of claim 1, wherein the programmable fault information storage array further includes:

a plurality of pairing units with each pairing unit coupled to a corresponding backup memory space in the register file, wherein each pairing unit stores one of the main memory fault addresses of the main memory spaces, and each pairing unit checks if the received main memory space pointed by the access command matches the main memory fault address stored internally, and according to the inspection result, each pairing unit outputs the corresponding bit of the backup memory address and the corresponding bit of the decision signal.

3. The memory structure of claim 1, wherein the record control unit further includes:
an output enable signal generation circuit coupled to the programmable fault information storage array for generating a main memory unit enable signal to enable the main memory unit when the main memory space pointed by the access command is fault-free, and generating a register file enable signal to enable the register file when the main memory space pointed by the access command is faulty.

4. The memory structure of claim 1, wherein the clocking signal generation circuit further comprises:
a logic decision unit for receiving the decision signal and using the decision signal to determine if the main memory space pointed by the access command is faulty and then outputting a decision result;
a first delay circuit for receiving the decision result and outputting a delayed decision result;
a second delay circuit for receiving the decision result and outputting a delayed decision result;
a first NOR gate for receiving the output from the logic decision unit and output from the first delay circuit;
a second NOR gate for receiving the output from the logic decision unit and the output from the second delay circuit;
a first inverter having an input terminal coupled to the output terminal of the first NOR gate and an output terminal for outputting the clocking signal required by the register file;
a second inverter having an input terminal coupled to the output terminal of the second NOR gate;
a third inverter having an input terminal coupled to a main clocking signal; and
a third NOR gate having a first input terminal and a second input terminal coupled to the output terminal of the second inverter and the output terminal of the third inverter respectively, and an output terminal for outputting the clocking signal required by the main memory unit.

5. The memory structure of claim 4, wherein the logic decision unit comprises:
a plurality of NAND gates with the input terminal of each NAND gate coupled to a corresponding bit of the decision signal;
a fourth NOR gate having a plurality of input terminals with each input terminal coupled to one of the output terminals of one of the NAND gates; and
a fourth inverter having an input terminal coupled to the output terminal of the fourth NOR gate and an output terminal for outputting the decision result.

6. The memory structure of claim 1, wherein the register file comprises:
a plurality of memory cells, wherein each memory cell determines if an access to its internal data is provided according to the corresponding bit in the backup memory address.

7. The memory structure of claim 6, wherein each memory coil comprises:
an enable terminal for receiving a corresponding bit from the backup memory address;
a data access terminal for providing the internal data of the-access memory cell;
a complementary data access terminal for providing the internal complementary data of the access memory cell;
a fifth inverter having an input terminal coupled to the enable terminal;
a first pass gate having a first gate coupled to the enable terminal, a second gate coupled to the output terminal of the fifth inverter and a first connecting terminal coupled to the data access terminal;
a second pass gate having a first gate coupled to the enable terminal, a second gate coupled to the output terminal of the fifth inverter and a first connecting terminal coupled to the complementary data access terminal;
a sixth inverter having an input terminal coupled to the second connecting terminal of the first pass gate and an output terminal coupled to the second connecting terminal of the second pass gate; and
a seventh inverter having an input terminal coupled to the second connecting terminal of the second pass gate and an output terminal coupled to the second connecting terminal of the first pass gate.

8. The memory structure of claim 1, wherein the re-buffer multiplexer comprises:
a plurality of re-buffer multiplexing units, each having:
an eighth inverter having an input terminal for receiving a corresponding bit from the main memory unit;
a ninth inverter having an input terminal for receiving a corresponding bit from the main memory unit;
a tenth inverter having an input terminal for receiving a corresponding bit from the register file;
an eleventh inverter having an input terminal for receiving a corresponding bit from the register file;
a first P-type transistor having a gate for receiving a clocking signal required by the main memory unit, a source coupled to a first voltage and a drain coupled to the input terminal of the eighth inverter;
a second P-type transistor having a gate for receiving a clocking signal required by the main memory unit, a source coupled to a first voltage and a drain coupled to the input terminal of the ninth inverter;
a third P-type transistor having a gate for receiving a clocking signal required by the register life, a source coupled to a first voltage and a drain coupled to the input terminal of the tenth inverter;
a fourth P-type transistor having a gate for receiving a clocking signal required by the register file, a source coupled to a first voltage and a drain coupled to the input terminal of the eleventh inverter;
a first N-type transistor having a gate coupled to the output terminal of the eighth inverter and a source coupled to a second voltage;
a second N-type transistor having a gate coupled to the output terminal of the ninth inverter and a source coupled to the second voltage;
a third N-type transistor having a gate coupled to the output terminal of the tenth inverter and a source coupled to the second voltage;
a fourth N-type transistor having a gate coupled to die output terminal of the eleventh inverter and a source coupled to the second voltage; and
a re-buffer having a first and a second input terminal and a first and a second output terminal, wherein the first input terminal is coupled to the drain of the first N-type transistor and the drain of the third N-type transistor, and the second input terminal is coupled to the drain of the second N-type transistor and the drain of the fourth N-type transistor.

9. The memory structure of claim 8, wherein the first voltage is a voltage source and the second voltage is a ground voltage.

10. The memory structure of claim 8, wherein the re-buffer further includes:
- a twelfth inverter having an input terminal coupled to the first input terminal of the re-buffer;
- a thirteenth inverter having an input terminal coupled to the second input terminal of the re-buffer;
- a first pull-up circuit coupled to die input terminal of the twelfth inverter for raising the potential to the first voltage level when the first input terminal of the re-buffer is at a logic '1' level;
- a second pull-up circuit coupled to the input terminal of the thirteenth inverter for raising the potential to the first voltage level when the second input terminal of the re-buffer is at a logic '1' level;
- a first memory unit coupled to the input terminal of the twelfth inverter for maintaining the logic state at the first input terminal of the re-buffer;
- a second memory unit coupled to die input terminal of the thirteenth inverter for maintaining the logic state at the second input terminal of the re-buffer;
- an AND unit having a first input terminal coupled to the first input terminal of the re-buffer and a second input terminal coupled to the second input terminal of the re-buffer for performing an AND computation and outputting the computational result after a prescribed delay period;
- a fifth P-type transistor having a gate coupled to the output terminal of the AND unit, a source coupled to the first voltage and a drain coupled to the input terminal of the twelfth inverter;
- a sixth P-type transistor having a gate coupled to the output terminal of the AND unit, a source coupled to the first voltage and a drain coupled to the input terminal of the thirteenth inverter;
- a fifth N-type transistor having a gate coupled to the output terminal of the twelfth inverter, a source coupled to the first voltage and a drain coupled to the first output terminal of the re-buffer; and
- a sixth N-type transistor having a gate coupled to the output terminal of the thirteenth inverter, a source coupled to the second voltage and a drain coupled to the second output terminal of the re-buffer.

11. The memory structure of claim 1, wherein the main memory unit and the register file are synchronous memory.

12. The memory structure of claim 1, wherein the main memory unit includes four 8K×40-bit memory modules and the register file includes one 64×40-bit memory module.

* * * * *